United States Patent

Cho et al.

[11] Patent Number: 5,346,844
[45] Date of Patent: Sep. 13, 1994

[54] METHOD FOR FABRICATING SEMICONDUCTOR MEMORY DEVICE

[75] Inventors: Hyun-jin Cho; Taek-yong Jang, both of Seoul, Rep. of Korea

[73] Assignee: Samsung Electronics Co., Ltd., Kyungki-do, Rep. of Korea

[21] Appl. No.: 907,068

[22] Filed: Jun. 30, 1992

[30] Foreign Application Priority Data

Oct. 17, 1991 [KR] Rep. of Korea .................. 91-18318

[51] Int. Cl.$^5$ ............................................. H01L 21/70
[52] U.S. Cl. ........................................ 437/52; 437/49; 437/228; 437/195
[58] Field of Search ..................... 437/48, 49, 51, 52, 437/228, 203, 195, 235

[56] References Cited

U.S. PATENT DOCUMENTS 4,565,712  1/1986  Noguchi et al. ................ 437/52
5,079,181  1/1992  Shimizu et al. ................ 437/52

Primary Examiner—Tom Thomas
Assistant Examiner—Tuan Nguyen
Attorney, Agent, or Firm—Cushman, Darby & Cushman

[57] ABSTRACT

A semiconductor memory device and fabricating method thereof including one transistor consisting of a source, a drain and a gate electrode, a bit line in contact with the drain region of the transistor via a first contact hole, a storage electrode in contact with the source region of the transistor via a second contact hole, a first planarized insulating layer formed under the bit line and a second planarized insulating layer formed under the storage electrode, whereby the material layer formed under the conductive layers, e.g., the bit line and storage electrode, is planarized to prevent stringers created due to surface indentations. Further, after a spacer is formed directly on the side walls of contact hole or on the side walls of a pattern for forming the contact hole, the contact hole is formed to prevent the contact between conductive layers, as a result, improving the memory device's reliability and being advantageous in realizing high density.

7 Claims, 6 Drawing Sheets

METHOD FOR FABRICATING SEMICONDUCTOR MEMORY DEVICE

BACKGROUND OF THE INVENTION

The present invention relates to a semiconductor memory device and fabricating method thereof, and more particularly to a semiconductor memory device and fabricating method thereof having improved reliability and integration.

Recently, the packing density and performance of VLSI devices has been greatly advanced. In the field of MOS-type DRAMs, those of 16 Mb have begun to be produced in mass, with study now being focused on DRAMs having densities of 64 Mb and higher. In these higher-density DRAMs, since their cell size becomes minutely small (below approx. 1.5 $\mu m^2$), various three-dimensional capacitor structures or dielectrics having a high dielectric constant, such as a $Ta_2O_5$ layer, have been considered.

Smaller cell size is made possible by reducing the distance between the conductor layers constituting a cell. Due to the higher integration, in DRAMs, the distance between gate electrodes set to a minimum feature size according to a design rule, becomes at least as small as the minimum feature size of a contact hole for connecting a bit line to a drain region or that connecting a storage electrode to a source region. This deteriorates device reliability.

FIG. 1 is a layout of a semiconductor memory device for illustrating a conventional fabricating method and a method of the present invention. In FIG. 1, a region defined by a dashed line outlining a zigzagged area is a mask pattern P1 for forming a field oxide layer for dividing a substrate into an active region and non-active region. Regions defined by solid lines into vertical rectangles throughout the substrate are mask patterns P2 for forming a gate electrode (word line). A region defined by a solid-lined square having diagonally crossing lines at the substrate's center is a mask pattern P3 for forming a contact hole for connecting a drain region of a transistor to a bit line. A region defined by a dash-and-dot line outlining a horizontal rectangle and containing mask pattern P3, is a mask pattern P4 for forming the bit line. A region within one end of mask pattern P1 and defined by a solid-lined square having one diagonally crossing line is a mask pattern P5 for connecting a storage electrode to a source region of the transistor.

FIG. 1 is a layout for forming a minimum-sized memory cell, which is formed to a minimum feature size according to its design rule. In FIG. 1, elliptical regions I, II and III indicate portions where conductor layers which should not be in contact with one another due to their different functions, do partly make contact with one another when the memory cell is fabricated based upon the layout. Here, region I indicates a portion in contact with the storage electrode and bit line, region II indicates a portion in contact with the storage electrode and gate electrode, and region III indicates a portion in contact with the bit line and gate electrode.

FIG. 2 is a cross-sectional view of a semiconductor memory device fabricated by a conventional method, taken along line AA' of FIG. 1.

In FIG. 2, circular portions A indicate contact portions with a bit line 30 and gate electrodes 18, illustrating region III of the layout. In order to minimize cell size, the distance between the gate electrodes is set to be equal to the width of a contact hole for bit line connection. However, in the memory device of FIG. 2 fabricated based upon the layout, the gate electrodes and bit line make contact with each other as in portion A because one side of the gate electrodes is exposed inside the contact hole due to an etching process for forming the contact hole. The contact problem between differently functioning conductor layers commonly takes place in regions I, II and III of FIG. 1, besides portion A. This is a main factor to paralyze normal operation. Circular portions B indicate portions having an excessively indented surface due to lower structures (transistor and bit line 30 in FIG. 2). The portions have a high possibility for creation of stringers during a process which deposits and etches a conductive material to form a storage electrode. Stringers contribute to the decrease of device reliability and are frequently created in portions having severely indented surfaces.

Since the semiconductor memory device fabricated by the above conventional method presents the problem of the creation of stringers in portions having severely indented surfaces or in contact with the conductor layers, the semiconductor device is unsuitable for memory devices having densities of 64 Mb and higher.

SUMMARY OF THE INVENTION

Therefore, it is an object of the present invention to provide a semiconductor memory device having improved density and reliability.

It is another object of the present invention to provide a method suitable for fabricating such a semiconductor memory device.

To accomplish the first object of the present invention, there is provided a semiconductor memory device comprising one transistor consisting of a source region, drain region and gate electrode, a bit line in contact with the drain region of the transistor via a first contact hole, and a storage electrode in contact with the source region of the transistor via a second contact hole, the semiconductor memory device further comprising a first planarized insulating layer formed under the bit line and a second planarized insulating layer formed under the storage electrode.

To accomplish the second object of the present invention, there is provided a method for fabricating a semiconductor memory device comprising the steps of: forming a first planarized insulating layer on a semiconductor substrate where a transistor having a source region, drain region and gate electrode is formed; forming a first contact hole by partly removing the first insulating layer formed on the drain region; forming a bit line connected to the drain region via the first contact hole; forming a second planarized insulating layer on the overall resultant structure; forming a second contact hole by partly removing the first and second insulating layers formed on the source region; and forming a storage electrode connected to the source region via the second contact hole.

To accomplish the second object of the present invention, there is provided another method for fabricating a semiconductor memory device comprising the steps of: forming a first planarized insulating layer on a semiconductor substrate where a transistor having a source region, drain region and gate electrode is formed; forming a first contact hole and a 1st second contact hole by partly removing the first insulating layer formed on the drain and source regions; forming a bit line in contact with the drain region via the first contact hole and a buried conductive layer in contact with the source region via the 1st second contact hole; forming a second planarized insulating layer on the overall resultant structure; forming a 2nd second contact hole by partly removing the second insulating layer formed on the buried conductive layer; and forming a storage electrode connected to the source region via the buried conductive layer.

BRIEF DESCRIPTION OF THE DRAWINGS

The above objects and other advantages of the present invention will become more apparent by describing in detail a preferred embodiment of the present invention with reference to the attached drawings in which.

DETAILED DESCRIPTION OF THE INVENTION

Figure 1:
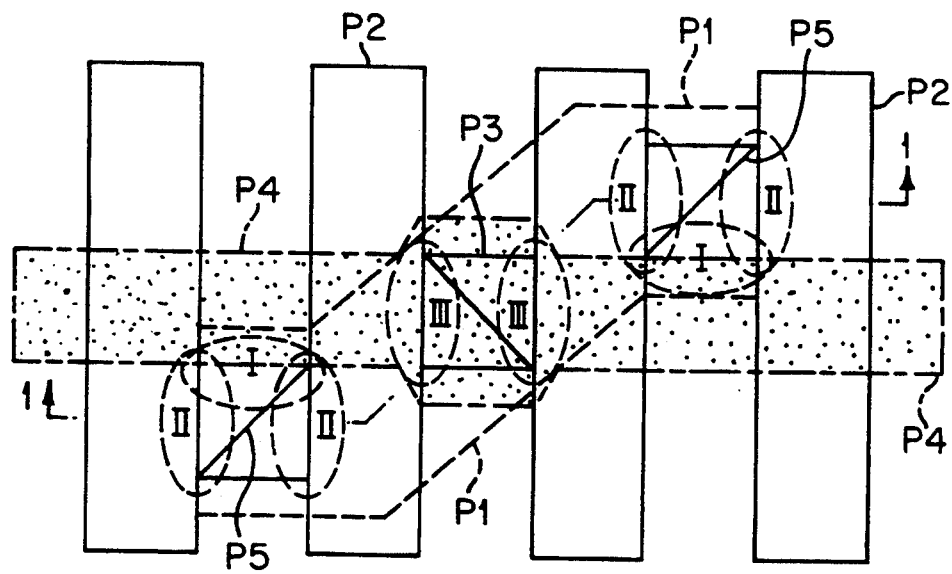
FIG. 1 is a layout of a semiconductor memory device for illustrating both a conventional fabricating method and a method of the present invention.

In FIGS. 3A–3E, FIG. 3A illustrates a step for forming a first contact hole 5 for connecting a bit line to a drain region 16 of a transistor, and a first spacer 40 on the inner side walls of the first contact hole. Transistors having a common drain 16 and respective sources 14 and gate electrodes 18 are formed on an active region of a semiconductor substrate 10 which is divided into active and nonactive regions. In order to insulate the transistors from other conductor layers (formed in later steps), a dielectric layer 20 is formed by covering an insulating material such as high temperature oxide (HTO) to a thickness of about 500 Å to 2,000 Å on the overall substrate where the transistors are formed. Subsequently, an insulating material for forming an even surface and which is one among or a combination of boro-phospho-silicate glass (BPSG), a tetra-ethyl-orthosilicate (TEOS) oxide layer, $Si_3N_4$, spin-on-glass (SOG), and a chemical vapor deposition (CVD) oxide layer, is covered to a thickness of about 3,000 Å to 5,000 Å and at a temperature of below about 400° C. After that, the insulating material is reflowed at about 800° to 900° C. to form a first insulating layer 22 having a uniform surface. Using mask pattern P3 of FIG. 1, dielectric layer 20 and first insulating layer 22 are partly etched to form a first contact hole 5 for connecting the bit line to the drain region. In this invention, among the above materials forming the first insulating layer, BPSG is particularly used. Here, the first contact hole exposes one side of gate electrodes 18 because the process is performed based upon the layout (FIG. 1) for forming a minimum-sized cell.

An insulating material having a different etching rate of anisotropic etching from that of first insulating layer 22, which is one among or a combination of a CVD oxide layer, $Si_3N_4$ nitride insulator, polysilicon which is not doped with an impurity, monocrystal silicon, and a plasma-enhanced tetraethyl-ortho silicate (PE-TEOS) oxide layer, is covered on the overall substrate where first contact hole 5 is formed, to a thickness of about 500 Å to 2,000 Å (represented by the dotted line). An anisotropical etching is carried out over the resultant structure to form a first spacer 40 on the inner side walls of first contact hole 5. In this invention, among the materials forming the first spacer, the CVD oxide layer is particularly used. Here, since the first spacer is formed to cover the inner side walls of the first contact hole, one side of the gate electrodes exposed to the inner side walls of the first contact hole is prevented from being in contact with a bit line formed in a later step. This can effectively prevent the paralyzation of device operation due to the contact between conductor layers which is caused by the conventional method.

Figure 3A:
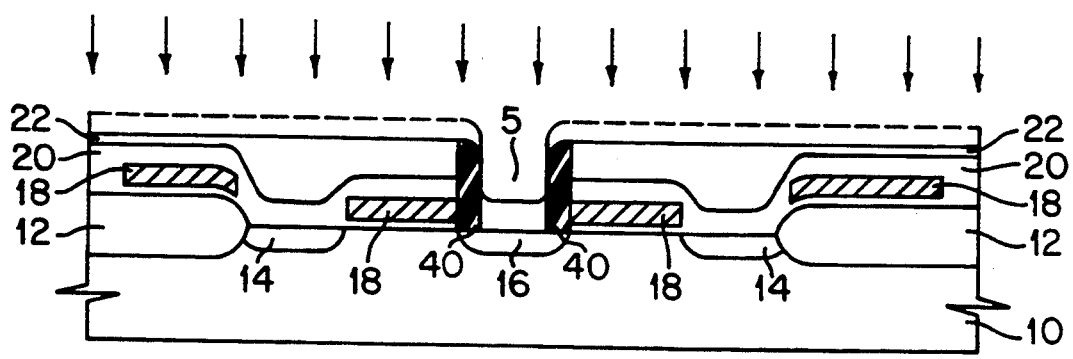
FIGS. 3A through 3E are cross-sectional views for illustrating a first embodiment of a fabricating method for a semiconductor memory device according to the present invention.
Figure 3B:
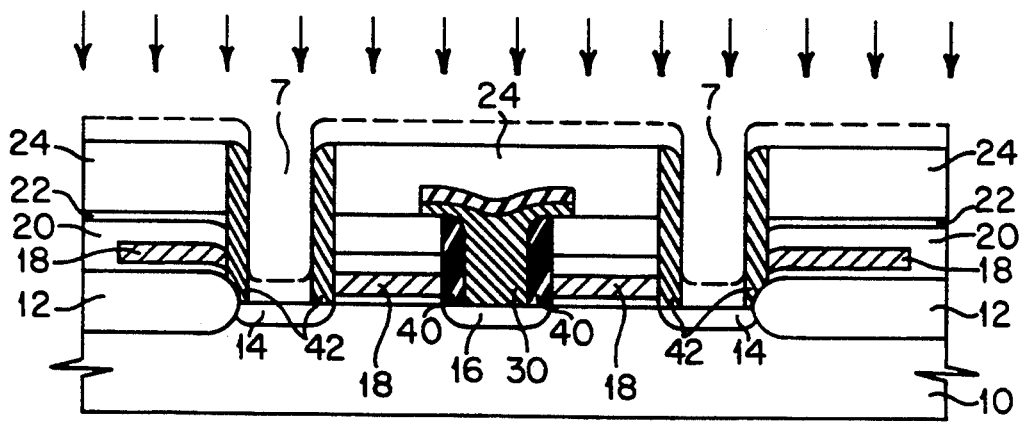

FIG. 3B illustrates a step for forming a bit line 30, a second contact hole 7 and a second spacer 42. In FIG. 3B, a conductive material for forming the bit line, e.g., polysilicon doped with impurities having the same conductivity as that of the source regions, is deposited on the overall substrate where first spacer 40 is formed, to a thickness of about 500 Å and until the first contact hole is plugged. A silicide, e.g, tungsten silicide (WSi), covers the polysilicon layer thinly. Using mask pattern P4 of FIG. 1, anisotropical etching is carried out over the resultant structure to form bit line 30. Here, the impurity-doped polysilicon and the tungsten silicide are stacked on first insulating layer 22 having a uniform surface so that the stringer created by the indentation of the lower structures is prevented.

Figure 2:
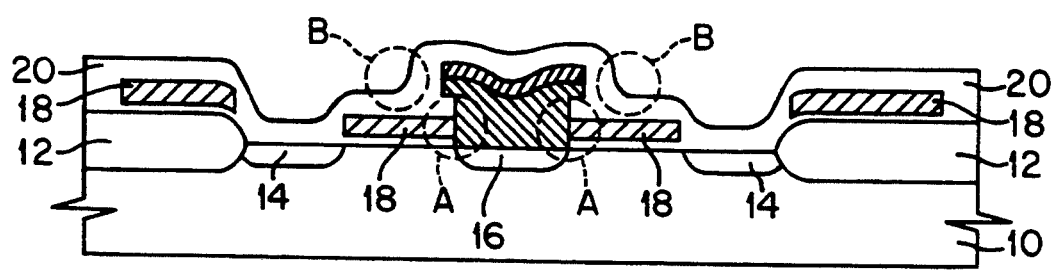
FIG. 2 is a cross-sectional view of a semiconductor memory device fabricated by a conventional method.

The stringer is liable to occur in greatly indented surfaces-as in portion B of FIG. 2. However, a stringer bridges conductive layers which should be electrically insulated from each other, thus deteriorating device reliability.

In FIG. 3B, this invention can prevent the occurrence of the stringer since, after the surface of bit line 30's lower structure (a structure formed before the bit line and of a material layer) is planarized, the conductive layer for forming the bit line is deposited. One or a combination of the materials mentioned in the description in connection with FIG. 3A to form first insulating layer 22, is covered to a thickness of about 3,000 Å to 5,000Å, on the overall resultant structure where bit line 30 is formed, until the surface is uniform, so as to form a second insulating layer 24. The present invention uses BPSG in particular. Using mask pattern P5 of FIG. 1, materials stacked on source region 14 of transistor, that is, dielectric layer 20, first insulating layer 22 and second insulating layer 24 are partly etched to form a second contact hole 7. Here, as described above, it is noted that one side of each gate electrode is exposed to the inner side walls of second contact hole 7.

One or a combination of the materials mentioned in the description with respect to FIG. 3A to form the first spacer, is covered on the overall resultant structure where the second contact hole has been formed to a thickness of about 500 Å, to 2,000 Å, (indicated by a dotted line), and is anisotropically etched, so as to form second spacer 42. The CVD oxide layer is used for the second spacer 42 in this invention. The second spacer is formed to cover the inner side walls of the second contact hole. Here, due to second spacer 42, the exposed one side of each gate electrode is able to be insulated from another conductive layer, e.g., a later-formed storage electrode.

Figure 3C:
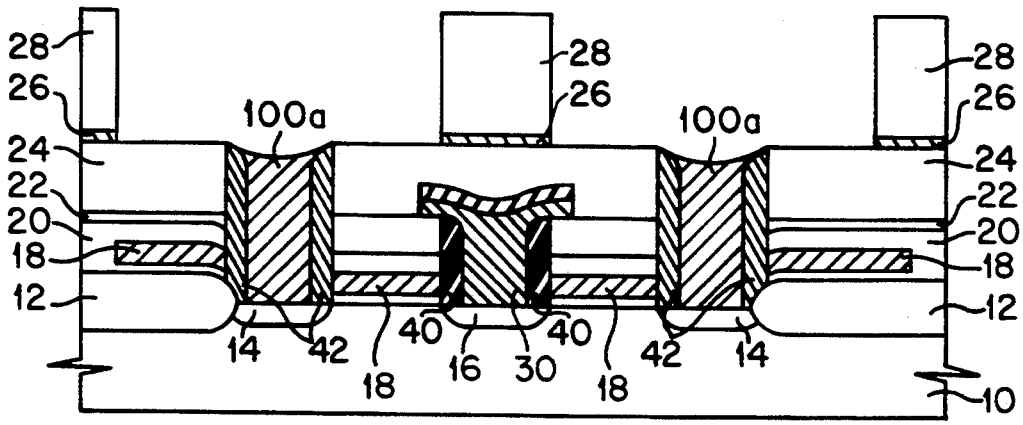

FIG. 3C illustrates a step for forming a reverse pattern 28 for forming the storage electrode. A conductive material for forming the storage electrode, for example, polysilicon doped with an impurity having the same conductivity as that of source region 14, is deposited and etched on the resultant structure where second spacer 42 is formed. The step is repeated until the second contact hole becomes full (this is a step of plugging the second contact hole), so as to form a column electrode 100a which connects the storage electrode to source region 14. A material for forming an etch-blocking layer 26, for example, nitride is covered by a thickness of about 1,000 Å, on the overall resultant structure. After that, an insulating material for forming the reverse pattern having a different etching rate from that of the material consisting of the etch blocking layer with respect to a wet etching is covered on the overall resultant structure to a thickness of about 6,000 Å. Reverse pattern 28 is completed by partly etching etch-blocking layer 26 and the insulating material for forming the reverse pattern, using a mask pattern (not shown in FIG. 1).

Figure 3D:
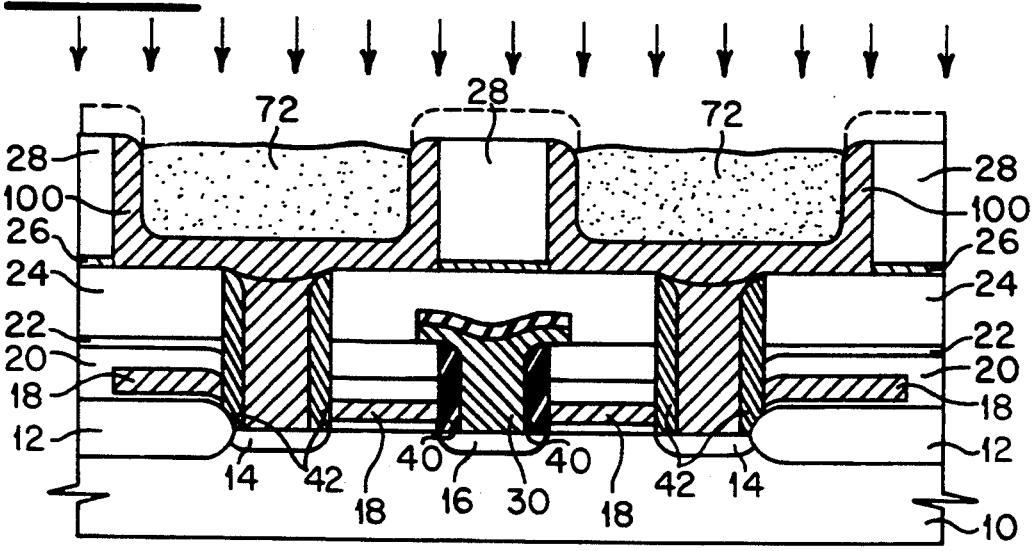

FIG. 3D illustrates a step for forming storage electrode 100. A conductive material forming the storage electrode, for example, polysilicon doped with an impurity having the same conductivity as that of source region 14 is covered on the overall resultant structure where reverse pattern 28 is formed, to a predetermined thickness. A photoresist is covered uniformly to the extent that the conductive material is blanketed, and is then etched back until the surface of the deposited conductive layer is partly exposed. By doing so, a photoresist pattern 72 is formed by filling up the wall formed by reverse pattern 28. Using photoresist pattern 72 as an etching mask, the partly exposed conductive material is etched to complete storage electrode 100.

Figure 3E:
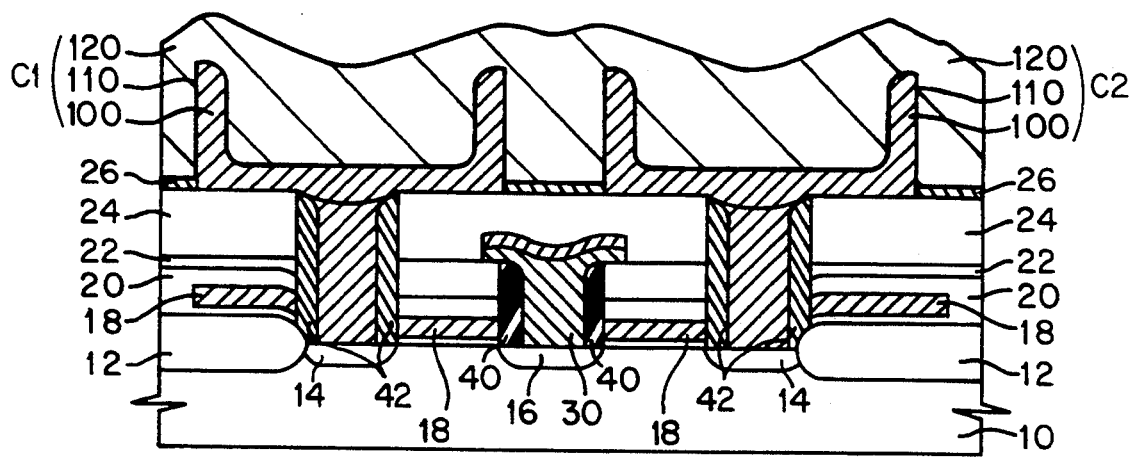

FIG. 3E illustrates a step of forming a dielectric layer 110 and a plate electrode 120. First, the photoresist and reverse patterns (72, 28 in FIG. 3D) are removed by a wet etching process. A dielectric material e.g., oxide/nitride/oxide (ONO) or $Ta_2O_5$, is covered on the overall resultant structure to form dielectric layer 110. Plate electrode 120 is completed by depositing a material such as polysilicon doped with an impurity on the overall resultant structure.

In the first embodiment of the present invention, stringers due to surface indentations are prevented by planarizing the surface of the material layer formed under the conductive layers, e.g., the bit line and storage electrode. Further, contact between conductive layers is prevented by forming the spacers on the inner side walls of the contact hole. These enhance memory device reliability and are favorable to higher integration.

In the subsequent descriptions referring to drawings, same numerals as in FIGS. 3A to 3E indicate like components.

Figure 4:
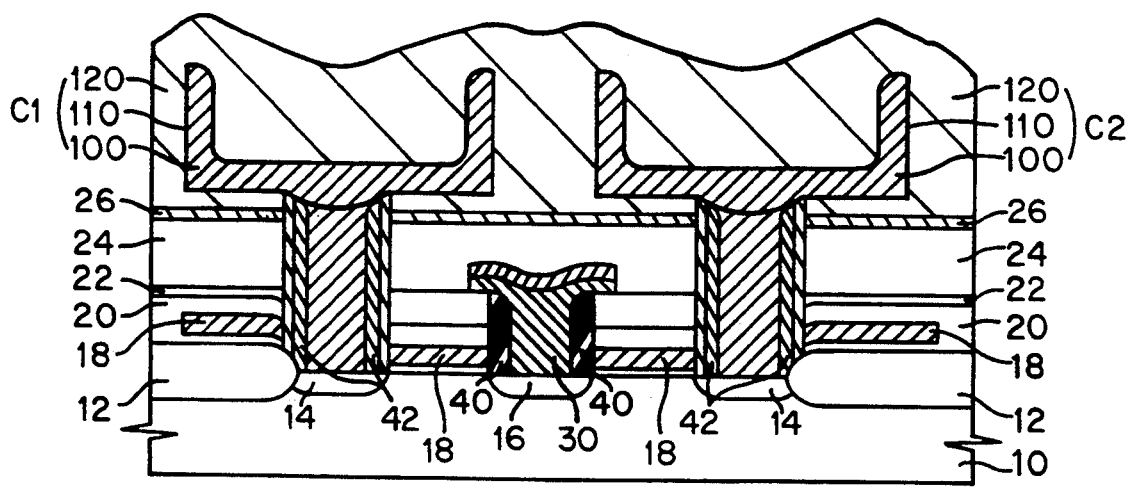
FIG. 4 is a cross-sectional view for illustrating a second embodiment of a fabricating method for a semiconductor memory device according to the present invention.

FIG. 4 is a cross-sectional view for illustrating a second embodiment of a fabricating method for a semiconductor memory device according to the present invention. The second contact hole is formed after the formation of a spacing layer (not shown in FIG. 4 because a later step removes the spacing layer) on etch-blocking layer 26 shown in FIG. 3C, so that even the bottom of storage electrode 100 can be used as an effective capacitor area for increasing cell capacitance. Etch-blocking layer 26 is interposed between the inner side walls of the second contact hole and second spacer 42 so that the second spacer is not damaged later by a wet-etching step.

The memory device fabricated by the second embodiment has cell capacitance greater than that of the memory device fabricated by the first embodiment of the present invention.

Figure 5A:
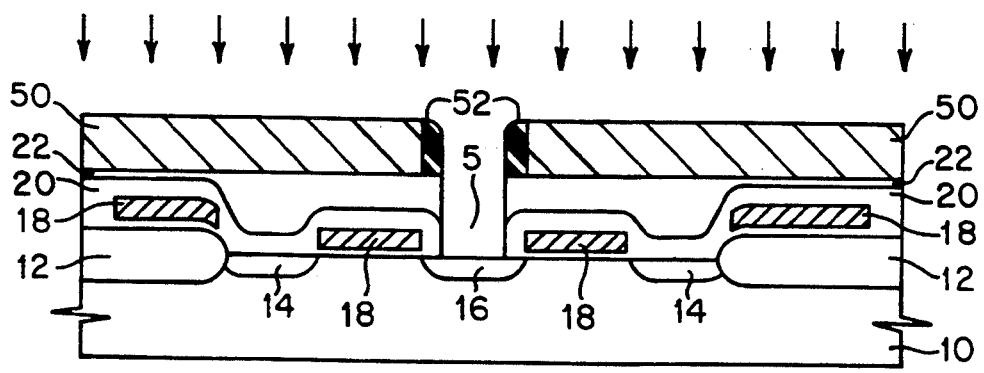
FIGS. 5A and 5B are cross-sectional views for illustrating a third embodiment of a fabricating method for a semiconductor memory device according to the present invention.
Figure 5B:
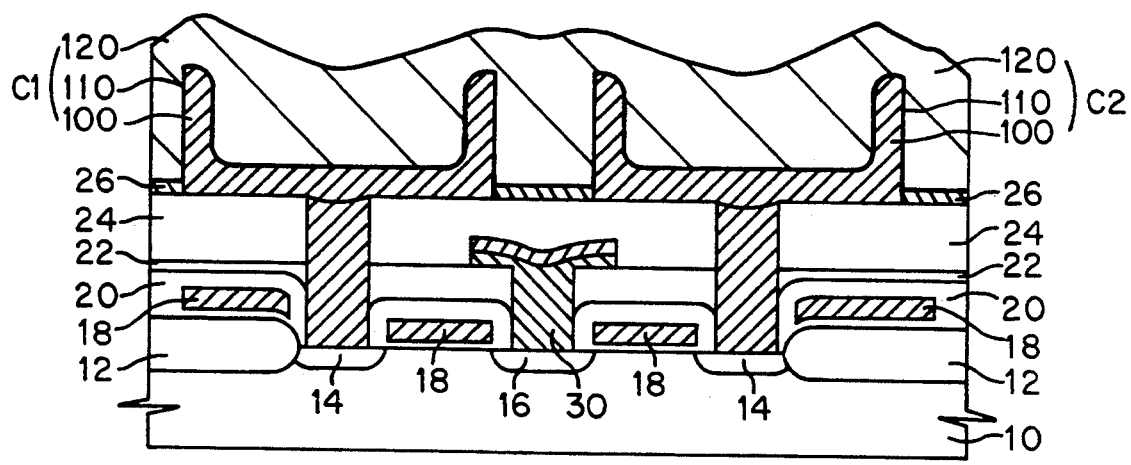

FIGS. 5A and 5B are cross-sectional views for illustrating a third embodiment of a fabricating method for a semiconductor memory device according to the present invention, having a different method of forming the first and second contact holes.

Using the same method as that of FIG. 3A, a material which enables patterning by having a different etching rate from that of the material forming the first insulating layer with respect to an anisotropical etching, for example, polysilicon or photoresist, is deposited on the overall resultant structure where first insulating layer 22 and its lower structure (that is, a transistor) are formed, to a thickness of about 1,000 Å to 3,000 Å. The deposited material is anisotropically etched using mask pattern P3 of FIG. 1, to form a pattern 50 for forming the first contact hole. A material having a different etching rate from that of the material forming the first insulating layer with respect to the anisotropical etching, for example, polysilicon in the case that polysilicon is used as the material forming pattern 50 or an oxide layer allowing a low temperature deposition in the case that photoresist is used as the material forming pattern 50, is covered on the overall resultant structure where pattern 50 is formed, to a thickness of about 500 Å to 2,000 Å. After that, anisotropical etching is carried out to form a third spacer 52. The first contact hole 5 is formed by anisotropical etching down to the surface of the substrate, using pattern 50 and third spacer 52 as an etching mask.

In the first embodiment, to solve the contact problem between the conductive layers which is the trouble in the conventional method, the first contact hole is formed using mask pattern P3 directly on first insulating layer 22 and dielectric layer 20, and the first spacer made of insulating material is additionally formed on the inner side walls of the contact hole. However, as shown in FIG. 5A, the third embodiment can obtain the same insulating effect as the first spacer of the first embodiment by forming pattern 50 for forming the first contact hole using mask pattern P3 on first insulating layer 22, forming the third spacer on the inner side walls of pattern, and forming a first contact hole smaller than the minimum feature size on first insulating layer 22 and dielectric layer 20, using pattern 50 and the third spacer as an etching mask.

Subsequently, in FIG. 5B, bit line 30 and second insulating layer 24 are formed according to the same method as the first embodiment. After that, following the same method as that described with respect to FIG. 5A, materials stacked on the source region, that is, second insulating layer 24, first insulating layer 22 and dielectric layer 20, are partly removed to form a second contact hole smaller than the minimum feature size. Also, as in the first embodiment, storage electrode 100, dielectric layer 110 and plate electrode 120 are formed to complete a semiconductor where memory cells each having one transistor and one capacitor are repeatedly formed on a substrate.

Figure 6:
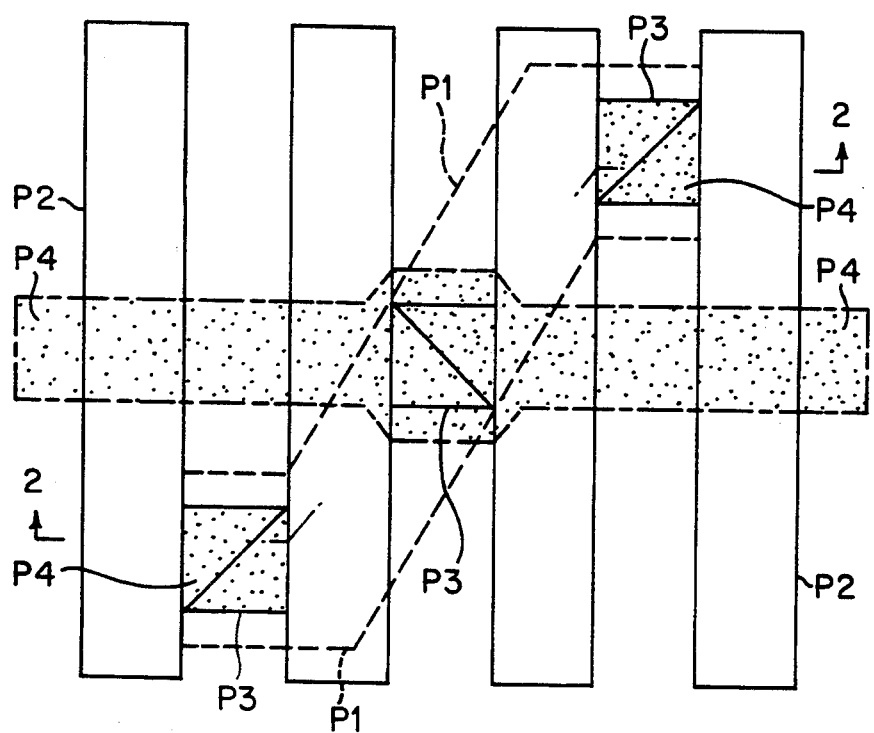
FIG. 6 is a layout for illustrating another embodiment of a fabricating method for a semiconductor memory device of the present invention.

FIG. 6 is a layout for illustrating another embodiment of a fabricating method for a semiconductor memory device of the present invention. The difference from the layout of FIG. 1 is that mask pattern P3 for forming the first and second contact holes and mask pattern P4 for forming the bit line and buried conductive layer, are both formed in one mask sheet. Here, it should be noted that, if the bit line and buried conductive layer are formed on one mask sheet, portion I of FIG. 1 does not exist in FIG. 6 because the mask patterns are formed according to its design rule.

Figure 7A:
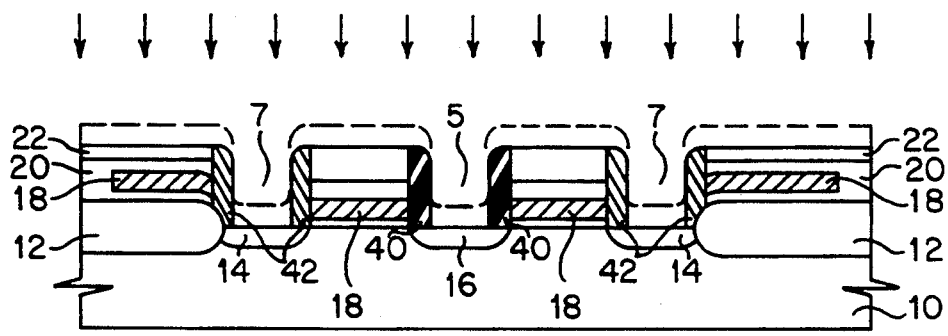
FIGS. 7A, 7B and 7C are cross-sectional views for illustrating a fourth embodiment of a fabricating method for a semiconductor memory device according to the present invention.
Figure 7B:
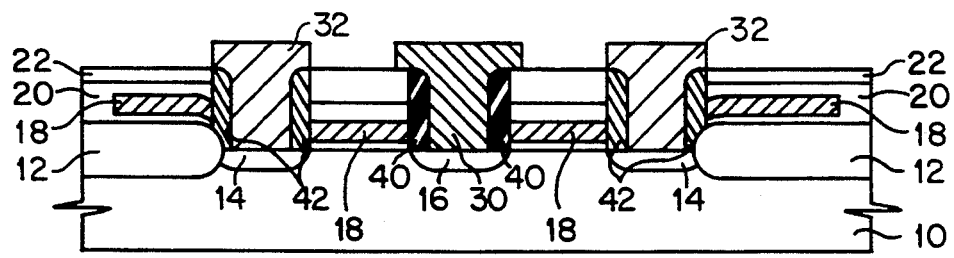
Figure 7C:
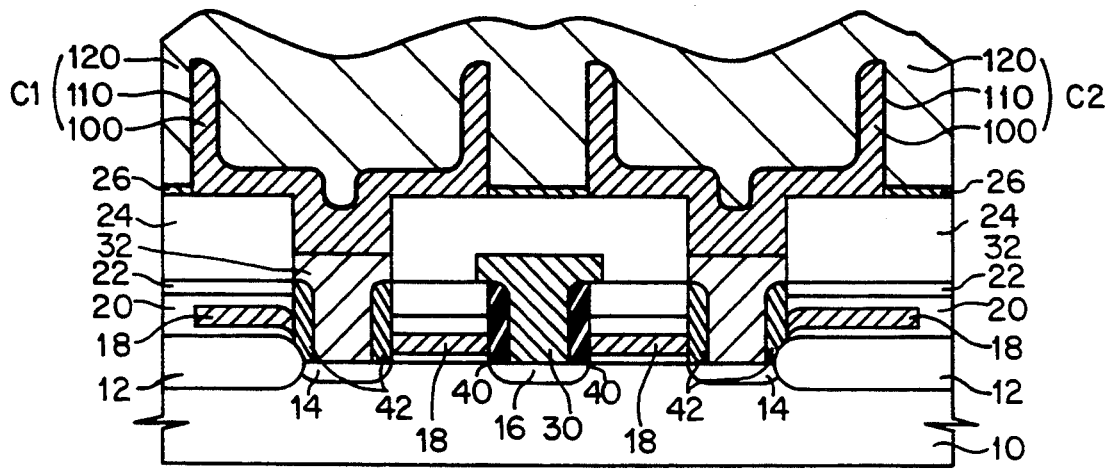

FIGS. 7A, 7B and 7C are cross-sectional views for illustrating a fourth embodiment of a fabricating method for a semiconductor memory device according to the present invention. Differently from the first, second and third embodiments, the fourth embodiment forms the first and second contact holes simultaneously.

First, FIG. 7A illustrates a step of forming first and second contact holes 5 and 7, and first and second spacers 40 and 42. Using the same method as that of FIG. 3A, first insulating layer 22 and dielectric layer 20 are partly etched using mask pattern P3 to form a first and a 1st-typed second contact hole 5 and 7 on the resultant structure where first insulating layer 22 is formed. In the same manner as described with respect to FIG. 3A, first and second spacers 40 and 42 are formed on the inner side walls of the first and second contact holes.

FIG. 7B illustrates a step of forming bit line 30 and buried conductive layer 32. A conductive material, e.g., polysilicon doped with an impurity having the same conductivity as that of source 14 and drain 16 is deposited on the resultant structure where first and second spacers 40 and 42 are formed, until the first contact hole and the 1st-typed second contact hole are filled up. The conductive material is deposited to have a predetermined thickness at the reference of the surface of first insulating layer 22. Using mask pattern P4 of FIG. 6, a photoetching is carried out to form bit line 30 and buried conductive layer 32. Here, buried conductive layer 32 functions as an interlayer for connecting the storage electrode and source region 14 of the transistor.

In the first, second and third embodiments, since the second contact hole is formed through second insulating layer 24, first insulating layer 22 and dielectric layer 20 and the contact hole deepens by the thickness of the three layers, a void is created in the hole, possibly decreasing device reliability. However, in the fourth embodiment, since the storage electrode and source region are connected through buried conductive layer 32, the probability of producing the void is by far reduced and the contact hole is formed reliably.

FIG. 7C illustrates a step of forming storage electrode 100, dielectric layer 110 and plate electrode 120. Second insulating layer 24 is formed on the resultant structure where bit line 30 and buried conductive layer 32 are formed. After that, a 2nd second contact hole for connecting buried conductive layer 32 and the storage electrode is formed. Likewise as in the first, second and third embodiments, storage electrode 100, dielectric layer 110 and plate electrode 120 are formed.

In the fourth embodiment, a void, which may be created in the contact hole, can be prevented by connecting storage electrode 100 and source region 14 of the transistor while taking buried conductive layer 32 as an interlayer.

Figure 8A:
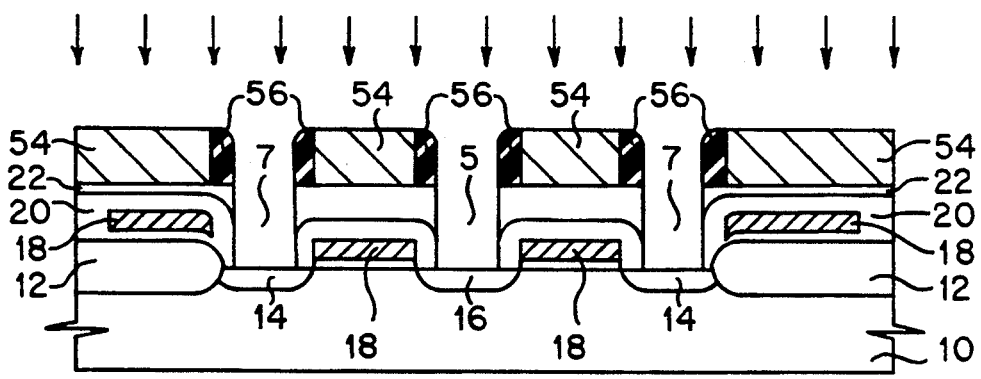
FIGS. 8A, 8B and 8C are cross-sectional views for illustrating a fifth embodiment of a fabricating method for a semiconductor memory device according to the present invention.
Figure 8B:
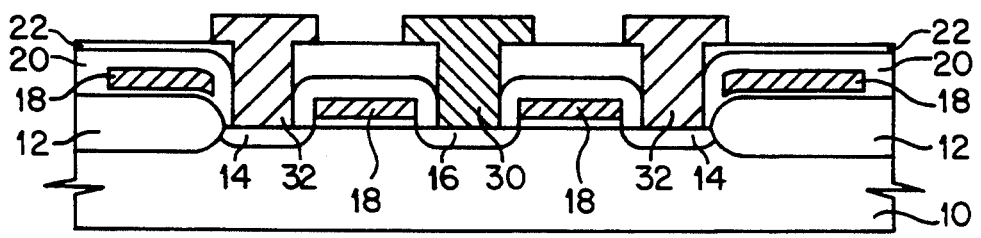
Figure 8C:
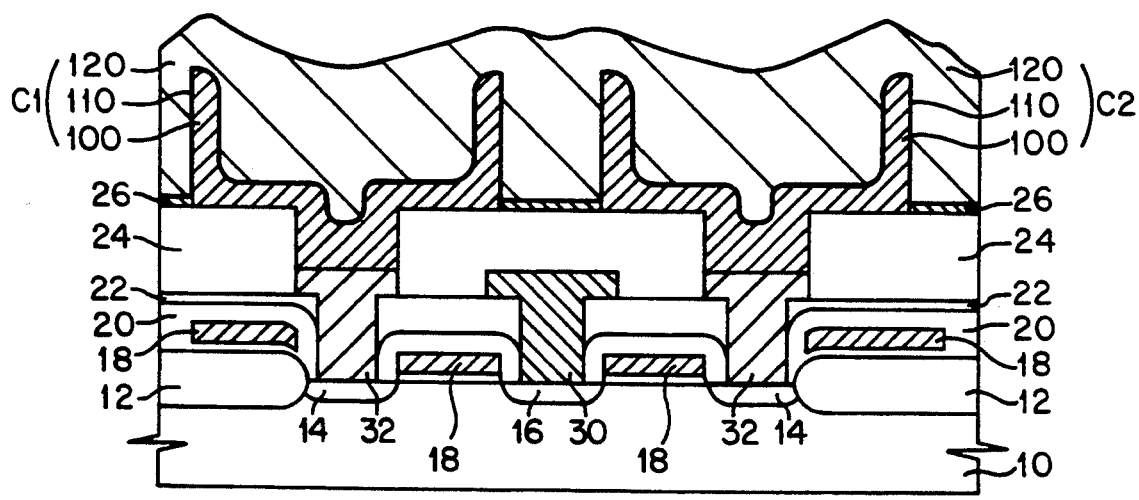

FIGS. 8A, 8B and 8C are cross-sectional views for illustrating a fifth embodiment of a fabricating method for a semiconductor memory device according to the present invention. Here, the first and second contact holes are formed using the mask pattern of FIG. 6 and the method of the third embodiment.

In FIG. 8A, using the same method as that of FIG. 3A, first insulating layer 22 is formed, and using the mask pattern of FIG. 6 and following the same method as that of FIG. 5A, pattern 54 for forming the contact holes and a side wall spacer 56 are formed. Anisotropical etching is carried out on the overall resultant structure using pattern 54 and side wall spacer 56 as an etching mask to form first contact hole 5 and 1st second contact hole 7. Subsequently, in FIG. 8B, using the same method as that of FIG. 7B, bit line 30 and buried conductive layer 32 are formed. In FIG. 8C, using the same method as that of FIG. 7C, storage electrode 100, dielectric layer 110 and plate electrode 120 are formed to complete a memory device wherein memory cells are repeatedly formed. Here, each memory cell has one transistor and one capacitor.

As described above in detail, according to the method of fabricating a semiconductor memory device of the present invention, the material layer formed under the conductive layers, e.g., the bit lines and storage electrodes are planarized to prevent stringers created due to their surface indentation. Further, after a spacer is formed directly on the side walls of contact hole or on the side walls of a pattern for forming the contact hole, the contact hole is formed which prevents the contact between conductive layers. As a result, the present invention improves the reliability of memory devices and is advantageous in realizing the high device density.

While the invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a semiconductor memory device comprising the steps of:
   forming a first planarized insulating layer on a semiconductor substrate where a transistor having a source, drain and gate electrode is formed;
   forming a first contact hole by partly removing said first insulating layer formed on said drain region;
   forming a first spacer on an inner side wall of said first contact hole;
   forming a bit line connected to said drain region via said first contact hole;
   forming a second planarized insulating layer on the overall resultant structure;
   forming a second contact hole by partly removing said first and second insulating layers formed on said source region;
   forming a second spacer on an inner side wall of said second contact hole; and forming a storage electrode connected to said source region via said second contact hole.

2. A method for fabricating a semiconductor memory device as claimed in claim 1, wherein a step of forming an insulating layer is additionally carried out after said step of forming the transistor on the substrate.

3. A method for fabricating a semiconductor memory device as claimed in claim 2, wherein an insulating material such as HTO is used for the material of said insulating layers.

4. A method for fabricating a semiconductor memory device as claimed in claim 1, wherein said step Of forming the first spacer on the inner side walls of said contact hole is divided into a step of covering a first insulating material having the different etching rate from that of said first insulating layer with respect to a first anisotropical etching on the overall resultant structure and a step of carrying out said first anisotropical etching on the overall resultant structure, and said step of forming the second spacer on the inner side walls of said second contact hole is divided into a step of covering a second insulating material having the different etching rate from that of said second insulating layer with respect to a second anisotropical etching on the overall resultant structure and a step of carrying out said second anisotropical etching on the overall resultant structure.

5. A method for fabricating a semiconductor memory device as claimed in claim 4, wherein said first and second insulating layers are formed of one or a combination of BPSG, a TEOS oxide layer, silicon nitride, SOG and a CVD oxide layer.

6. A method for fabricating a semiconductor memory device as claimed in claim 5, wherein said first and second spacers are formed of one or a combination of a CVD oxide layer, a nitride insulating material, undoped polysilicon, monocrystal silicon and a PE-TEOS oxide layer.

7. A method for fabricating a semiconductor memory device comprising the steps of:
    forming a first planarized insulating layer on a semiconductor substrate where a transistor having a source, drain and gate electrode is formed;
    forming a first contact hole by partly removing said first insulating layer formed on said drain region, said first contact hole removing step including the steps of:
    forming a first material layer where a first pattern for forming said first contact hole is formed, on the overall resultant structure where said first insulating layer is formed,
    forming a third spacer on the inner side walls of said first pattern, and
    anisotropically etching on the resultant structure using said first pattern and third spacer as an etching mask and taking the surface of said substrate as its etching end point;
    forming a bit line connected to said drain region via said first contact hole;
    forming a second planarized insulating layer on the overall resultant structure;
    forming a second contact hole by partly removing said first and second insulating layers formed on said source region, said second hole forming step including the steps of:
    forming a second material layer where a second pattern for forming said second contact hole is formed on the overall resultant structure where said second insulating layer is formed,
    forming a fourth spacer on the inner side wall of said second pattern, and
    anisotropically etching on the resultant structure using said second pattern and fourth spacer as an etching mask and taking the surface of said substrate as its etching end point; and
    forming a storage electrode connected to said source region via said second contact hole.

* * * * *